United States Patent
Tooi et al.

(10) Patent No.: US 8,129,818 B2
(45) Date of Patent: Mar. 6, 2012

(54) POWER DEVICE

(75) Inventors: Shigeo Tooi, Tokyo (JP); Tetsujiro Tsunoda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/058,544

(22) PCT Filed: Oct. 14, 2008

(86) PCT No.: PCT/JP2008/068565
§ 371 (c)(1),
(2), (4) Date: Feb. 11, 2011

(87) PCT Pub. No.: WO2010/044135
PCT Pub. Date: Apr. 22, 2010

(65) Prior Publication Data
US 2011/0133312 A1 Jun. 9, 2011

(51) Int. Cl.
*H01L 29/739* (2006.01)

(52) U.S. Cl. . 257/586; 257/583; 257/510; 257/E29.201; 438/343; 438/221

(58) Field of Classification Search ............... 257/586, 257/583, 510, E29.201; 438/343, 221, 296, 438/353
See application file for complete search history.

(56) References Cited

U.S. PATENT DOCUMENTS

| 5,321,281 | A | 6/1994 | Yamaguchi et al. |
| 6,107,650 | A | 8/2000 | Takahashi et al. |
| 6,127,720 | A * | 10/2000 | Nakura et al. ............ 257/509 |
| 6,781,199 | B2 | 8/2004 | Takahashi |
| 2003/0102486 | A1 | 6/2003 | Inoue et al. |
| 2003/0141542 | A1 | 7/2003 | Ishimura et al. |
| 2005/0045960 | A1 | 3/2005 | Takahashi |

FOREIGN PATENT DOCUMENTS

| JP | 63 124762 | 8/1988 |
| JP | 2000 058823 | 2/2000 |
| JP | 2000 269486 | 9/2000 |

(Continued)

OTHER PUBLICATIONS

International Search Report issued Dec. 16, 2008 in PCT/JP08/068565 filed Oct. 14, 2008.

*Primary Examiner* — Thinh T Nguyen
(74) *Attorney, Agent, or Firm* — Oblon, Spivak, McClelland, Maier & Neustadt, L.L.P.

(57) ABSTRACT

The present invention is a power device includes, a first conductive type semiconductor substrate, a second conductive type base region formed on a surface of the semiconductor substrate, a second conductive type collector region formed on a rear surface of the semiconductor substrate, a first conductive type emitter region formed on a surface of the base region, a trench gate formed via a gate insulating film in a first trench groove formed in the base region so as to penetrate the emitter region, a dent formed in the base region in proximity to the emitter region, a second conductive type contact layer formed on an inner wall of the dent, having a higher dopant density than that of the base region, a dummy trench formed via a dummy trench insulating film in a second trench groove formed at a bottom of the dent, and an emitter electrode electrically connected to the emitter region, the contact layer and the dummy trench, wherein the trench gate and the dummy trench reach the semiconductor substrate.

3 Claims, 4 Drawing Sheets

FOREIGN PATENT DOCUMENTS

| | | |
|---|---|---|
| JP | 2001 168333 | 6/2001 |
| JP | 2002 353456 | 12/2002 |
| JP | 2003 224278 | 8/2003 |
| JP | 2004 95962 | 3/2004 |
| JP | 2004 303964 | 10/2004 |
| JP | 2005 101514 | 4/2005 |
| JP | 2007 500454 | 1/2007 |

* cited by examiner

POWER DEVICE

BACKGROUND OF THE INVENTION

1. Field of the Invention

The present invention relates to a trench gate type power device that suppresses latchup in the event of a short circuit or the like and has high withstand voltage characteristics.

2. Background Art

Power devices are high withstand voltage semiconductor devices widely used for power control. Among power devices, IGBTs (Insulated Gate Bipolar Transistors) are excellent in the ability to miniaturize a cell structure and realize a high withstand voltage device or the like.

An IGBT is provided with a p-type base region on a surface and a p-type collector region on a rear surface of an n-type semiconductor substrate which is a conductivity modulation region. An n-type emitter region is formed on a surface of the base region. Trench gates are formed in a plurality of longitudinal trench grooves formed so as to penetrate the aforementioned emitter region.

Patent Document 1 discloses a semiconductor apparatus in which a contact hole is formed between a trench gate and another trench gate. As described in FIG. 3(f) of Patent Document 1, a p+ layer called "low resistance region" is formed on an inner wall of the aforementioned contact hole by thermal diffusion. The aforementioned p+ layer has an effect of reducing base resistance. Therefore, even when a back electromotive force is given between a source (emitter) and a drain (collector), a parasitic transistor made up of a source region, channel region and epitaxial layer does not easily turn ON. Thus, the configuration in FIG. 3(f) of Patent Document 1 can increase a withstand voltage.

Patent Document 1: Japanese Patent Laid-Open No. 2004-303964
Patent Document 2: Japanese Patent Laid-Open No. 2004-095962
Patent Document 3: Japanese Utility Model Laid-Open No. S63-124762
Patent Document 4: Published Japanese translations of PCT international publication for patent applications No. 2007-500454
Patent Document 5: Japanese Patent Laid-Open No. 2000-058823
Patent Document 6: Japanese Patent Laid-Open No. 2002-353456

DISCLOSURE OF THE INVENTION

Problems to be Solved by the Invention

In the event of a short circuit or the like of the IGBT, a current density in the base region becomes very high. In this case, a hole current density in a region of the base region in the vicinity of which a channel is formed also becomes very high. This may cause an n-p-n-p structure made up of an emitter region (n-type)-base region (p-type)-semiconductor substrate (n-type)-collector region (p-type) to produce latchup. Furthermore, a reverse bias applied between the semiconductor substrate and the base region causes a depletion layer to be formed in the vicinity of the interface between the two. When the depletion layer is bent without sufficiently expanding, electric field concentration may occur. The electric field concentration may deteriorate the withstand voltage of the power device.

Here, the configuration described in Patent Document 1 can avoid the aforementioned latchup and withstand voltage deterioration caused by the depletion layer. That is, the low resistance region described in FIG. 3(f) of Patent Document 1 allows holes in the base region to escape to the emitter electrode (referred to as "source extracting electrode" in Patent Document 1) and reduces the hole density in the base region. This makes the aforementioned latchup less likely to occur. Furthermore, the low resistance region extends to as far as the epitaxial layer (semiconductor substrate) and causes the aforementioned depletion layer to expand. Thus, it is possible to relax the electric field concentration due to the bending of the aforementioned depletion layer and increase the withstand voltage.

However, in the actual manufacturing of a power device, a plurality of product types according to different saturation currents may be provided as a lineup, and further the design may be changed. In such a case, the configuration described in Patent Document 1 requires a mask for formation of a trench groove and a mask for formation of a contact hole or the like to be prepared for each product type, for each design change, resulting in a problem of causing a cost increase.

The present invention has been implemented to solve the above described problems and it is an object of the present invention to provide a power device capable of sharing many steps among a plurality of product types, changing the design through minimum changes in steps, suppressing latchup and improving the withstand voltage.

Means for Solving the Problems

The present invention is a power device includes, a first conductive type semiconductor substrate, a second conductive type base region formed on a surface of the semiconductor substrate, a second conductive type collector region formed on a rear surface of the semiconductor substrate, a first conductive type emitter region formed on a surface of the base region, a trench gate formed via a gate insulating film in a first trench groove formed in the base region so as to penetrate the emitter region, a dent formed in the base region in proximity to the emitter region, a second conductive type contact layer formed on an inner wall of the dent, having a higher dopant density than that of the base region, a dummy trench formed via a dummy trench insulating film in a second trench groove formed at a bottom of the dent, and an emitter electrode electrically connected to the emitter region, the contact layer and the dummy trench, wherein the trench gate and the dummy trench reach the semiconductor substrate.

Other features of the present invention will be described more specifically below.

Advantage of the Invention

According to the present invention, it is possible to manufacture a power device capable of suppressing latchup and improving a withstand voltage at low cost.

Figure 1:
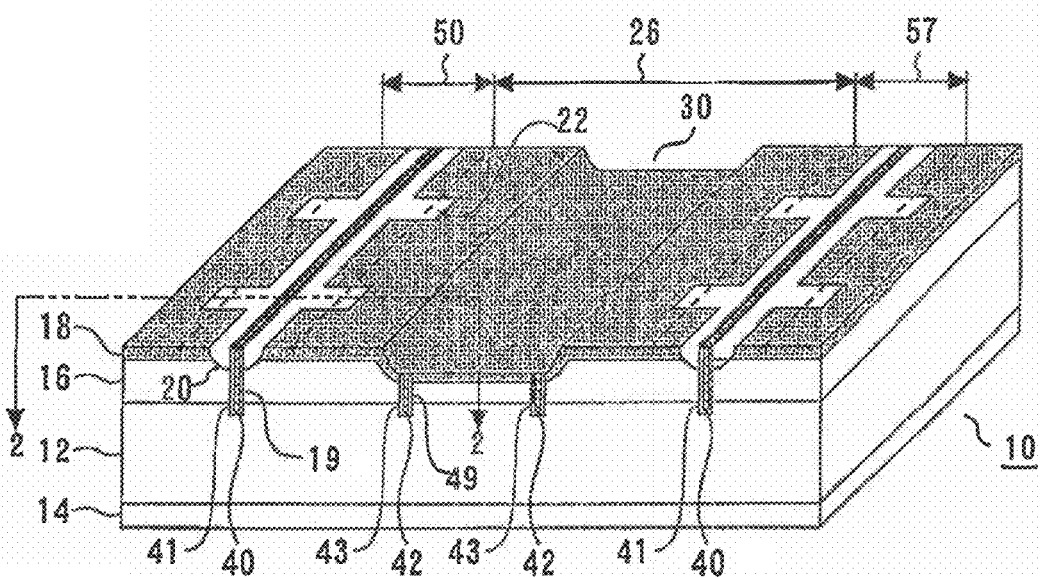
FIG. 1 is a perspective view including a cross section illustrating a power device of the first embodiment of this invention.

DESCRIPTION OF REFERENCE NUMERALS 10 power device
12 semiconductor substrate
14 collector region
16 base region
19 first trench groove
20 emitter region
22 emitter extending portion
30 dent
40 trench gate
41 gate insulating film
42 dummy trench
43 dummy trench insulating film
49 second trench groove

BEST MODE FOR CARRYING OUT THE INVENTION

Hereinafter, the best modes for carrying out the present invention will be described with reference to the accompanying drawings. Among the drawings, identical or equivalent parts will be assigned the same reference numerals and overlapping descriptions thereof will be simplified or omitted as appropriate.

Embodiment 1

FIG. 1 is a perspective view including a cross-sectional view illustrating a power device 10 of the present embodiment. The cross section shown in FIG. 1 or the like does not express any chip end face. The power device 10 is provided with a semiconductor substrate 12. The semiconductor substrate 12 is an n-layer in which low concentration n-type dopant is injected. The surface of the semiconductor substrate 12 is provided with a base region 16 where p-type dopant is injected. A p-type collector region 14 is formed on the rear surface of the semiconductor substrate 12.

An n-type emitter region 20 is formed on the surface of the base region 16. The emitter region 20 is an n+ layer where high concentration n-type dopant is injected. Furthermore, a first trench groove 19 is formed in the base region 16 so as to penetrate the emitter region 20. A gate insulating film 41 is formed in the first trench groove 19. Furthermore, a trench gate 40 is formed which contacts the emitter region 20 and the base region 16 via the gate insulating film 41. The trench gate 40 is formed of, for example, doped polysilicon or the like. The trench gate 40 receives a gate drive signal from the gate electrode, which will be described later. The region where the trench gate 40 and the emitter region 20 are formed is called "gate region 50."

A dent 30 is formed in the base region 16 adjoining the gate region 50. The dent 30 is a concave section formed in the base region 16. The dent 30 is formed to be shallower than the depth of the trench gate 40. Furthermore, a second trench groove 49 is provided at the bottom of the dent 30. The second trench groove 49 is formed to arrange a dummy trench which is a trench structure through which no gate drive signal is transmitted. A dummy trench insulating film 43 is formed in the second trench groove 49. A dummy trench 42 is further provided which contacts the base region 16 via the dummy trench insulating film 43. The dummy trench 42 is formed, for example, of doped polysilicon or the like.

The region in which the dent 30 is formed, which contacts the gate region 50, and in which an emitter electrode is to be formed is called an "emitter contact region 26." An emitter extending portion 22, which is part of the emitter region 20 is arranged in the emitter contact region 26. Furthermore, a contact layer 18 is formed on the surface of the base region 16 in the gate region 50 except the portion where the emitter contact region 26 and the emitter region 20 are formed. That is, the contact layer 18 is formed on the surface of the base region 16 except the gate insulating film 41, trench gate 40 and emitter region 20 (including the emitter extending portion 22). The contact layer 18 is a layer formed by injecting p-type dopant.

The p-type dopant is injected in such a way that a high concentration p+ layer is formed. The contact layer 18 is also formed on the inner wall of the dent 30 through inclined injection or the like as appropriate. That is, since the contact layer 18 is formed after the dent 30 is formed, the contact layer 18 is formed so as to extend along the inner wall of the dent 30. Here, the dopant density of the contact layer 18 is higher than the dopant density of the base region 16 where neither the emitter region 20 nor the contact layer 18 is formed.

Figure 2:
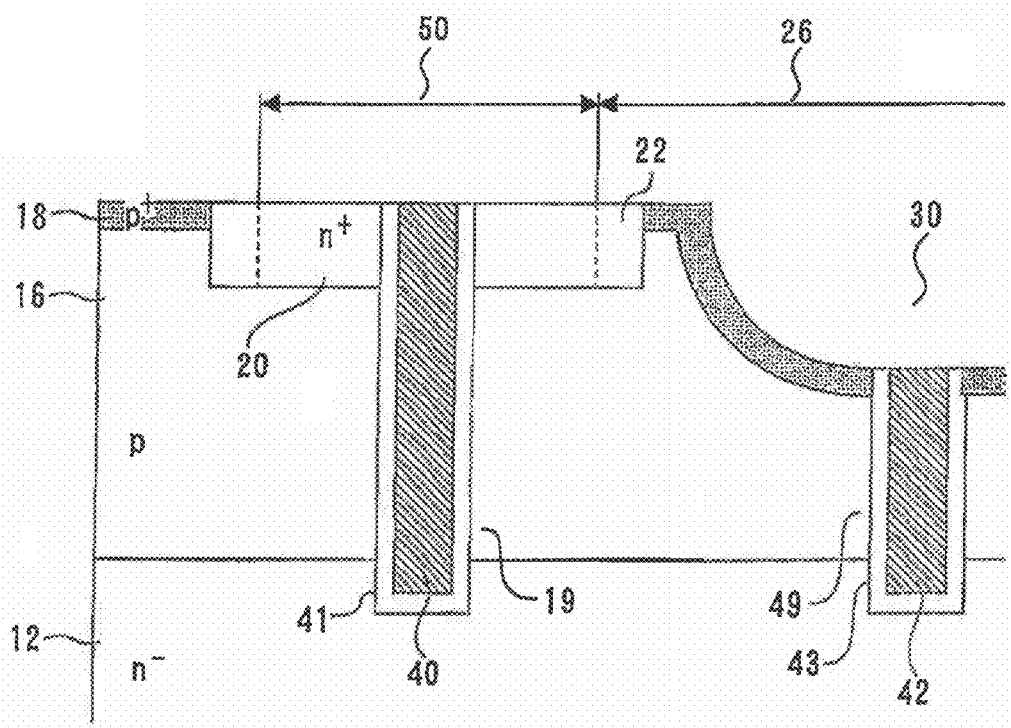
FIG. 2 is a view along a line 2-2 indicated by arrows in FIG. 1.
Figure 3:
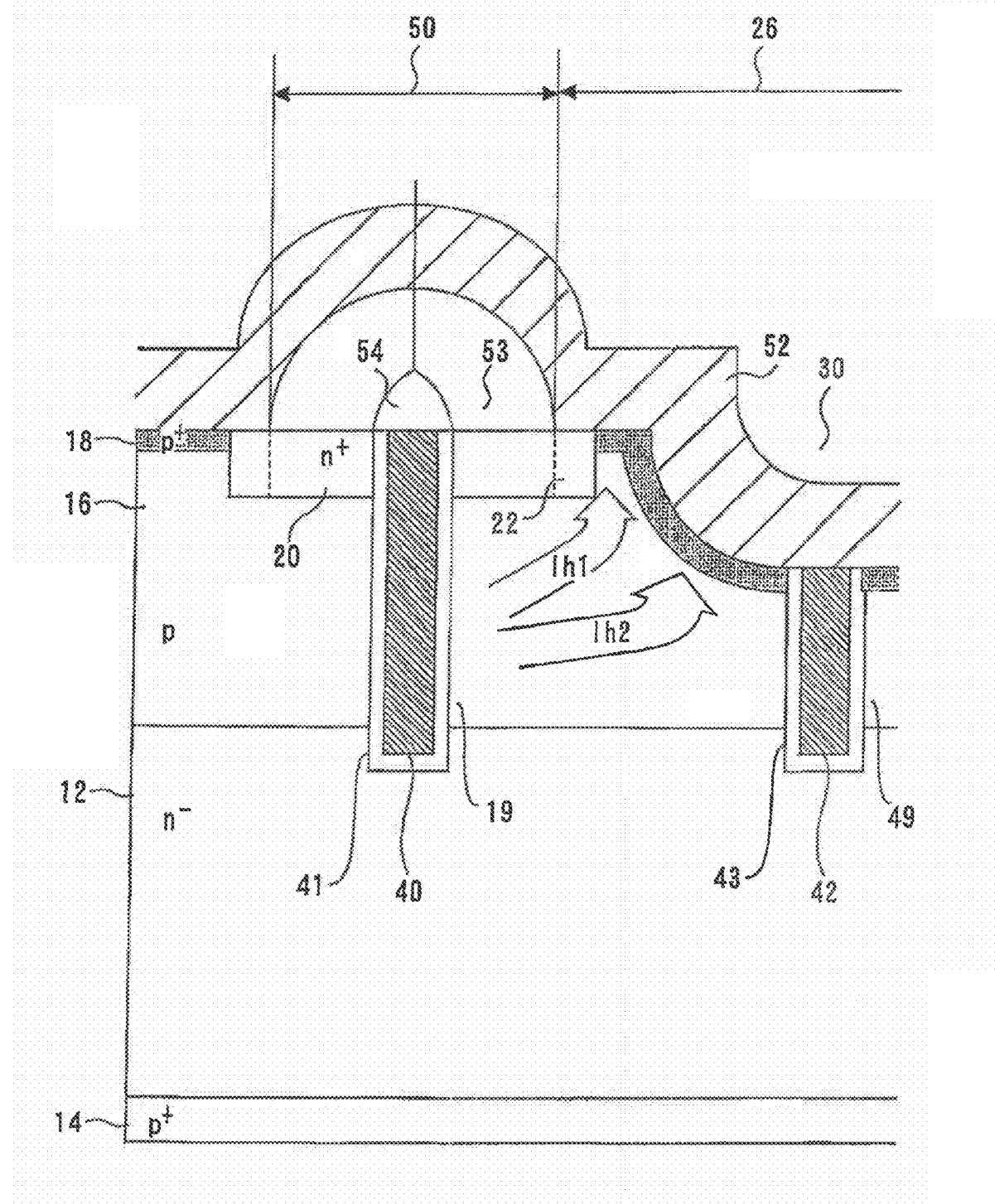
FIG. 3 is a diagram illustrating the same location and collector region as that of FIG. 2 and illustrating a situation in which the emitter electrode, gate electrode or the like are formed.

An emitter electrode is formed in the emitter contact region 26. The emitter electrode is shown in FIG. 3. FIG. 3 is a diagram illustrating the same location as that of FIG. 2 which is a cross-sectional view along a line 2-2 indicated by arrows, illustrating a situation in which the emitter electrode, gate electrode or the like are formed. As is understandable from FIG. 3, the emitter electrode 52 is formed so as to cover the emitter contact region 26. That is, the emitter electrode 52 is electrically connected to the emitter extending portion 22 of the emitter region 20. Furthermore, the emitter electrode 52 is also electrically connected to the contact layer 18 and the dummy trench 42. The emitter electrode 52 in the dent 30 is formed so as to cover the inner wall of the dent 30.

In the present embodiment, both the trench gate 40 that receives a gate drive signal and the dummy trench 42 connected to the emitter electrode 52 without receiving any gate drive signal reach the semiconductor substrate 12. Furthermore, as is understandable from FIG. 3, a gate wiring 54 is connected to the trench gate 40. A dielectric 53 is disposed so as to cover the gate wiring 54 to protect the trench gate 40 and the gate wiring 54 against noise and enhance insulating properties.

The configuration of the power device of the present embodiment is as shown above. Hereinafter, operations and effects of the power device of the present embodiment will be described with reference to FIG. 3.

As described above, when the current density is high at the time of a short circuit or the like, the hole current density may rise in a region of the emitter region 20 close to the first trench groove 19. In this case, since the dent 30 is formed in the base region 16 of the present embodiment, a path for holes shown by Ih2 is provided in addition to a path for holes shown by Ih1 in FIG. 3. That is, holes in the base region 16 quickly flow through and go out of the contact layer 18 formed along the dent 30. Therefore, holes are never concentrated on the base region 16. Thus, the presence of the dent 30 in the configuration of the present embodiment can prevent the hole current density in the base region 16 from increasing extremely.

Thus, suppressing the increase in the hole current density of the base region 16 has the effect of suppressing the occurrence of latchup in the n-p-n-p structure made up of the emitter region 20, base region 16, semiconductor substrate 12 and collector region 14.

Furthermore, since the dummy trench 42 is electrically connected to the emitter electrode 52, the voltage to be applied to the emitter region 20 is also applied to the dummy trench 42. Thus, in the case where the depletion layer generated between the base region 16 and the semiconductor substrate 12 in the vicinity of the first trench groove 19 extends to as far as the dummy trench 42, the depletion layer is expanded. Therefore, since the expansion of the depletion layer in the vicinity of the dummy trench 42 caused by the dummy trench 42 particularly contributes to the expansion of the depletion layer of the semiconductor substrate 12 whose dopant density is low, there is an effect of relaxing electric field concentration. This allows a high withstand voltage power device 10 to be realized.

As for a power device in general, a plurality of product types according to different saturation currents may be provided as a lineup, and further, the design may be changed to adjust characteristics of individual product types. In such a case, according to, for example, the configuration disclosed in Patent Document 1, masks for forming trench grooves need to be prepared one by one individually. Furthermore, when an attempt is made to increase the number of trench gates to increase the saturation current in the configuration described in Patent Document 1, trench grooves need to be newly formed, which makes it unavoidable to increase the cell area. Thus, the configuration according to Patent Document 1 involves a problem that the degree of freedom in changing a saturation current is low.

On the other hand, the configuration of the present invention can solve the above described problem. That is, according to the configuration of the present embodiment, since the dummy trench 42 can also be used as the trench gate 40, the degree of freedom in setting a saturation current is high. Here, assume that the deterioration in the latchup suppression effect caused by increasing the number of trench gates 40 is within an allowable range. Furthermore, since the dummy trench 42 of the present embodiment is formed in the same step as that of the trench gate 40, the number of trench gates 40 can be increased or decreased without changing masks for forming trench grooves. Whether to use the formed trench grooves as the trench gates 40 or dummy trenches 42 is determined by a mask for forming the dent 30 or the like. Thus, using the dummy trenches 42 as the trench gates 40 or, on the contrary, using the trench gates 40 as the dummy trenches 42 is realized without increasing the cell area. Thus, the configuration of the present embodiment provides a high degree of freedom in changing the saturation current in addition to latchup suppression and the ability to realize a high withstand voltage.

Furthermore, the dent 30 of the present embodiment does not reach the semiconductor substrate 12 and is shallower than the contact hole in Patent Document 1. Thus, it is easy to form the contact layer 18 and this is an advantageous step compared to Patent Document 1 also from the standpoint of embedding the emitter electrode (source extracting electrode) and the yield can also be improved. Thus, the configuration of the present embodiment makes it possible to realize multiple-device production and design changes at low cost and without increasing the level of difficulty in manufacturing.

Furthermore, the semiconductor apparatus (power device) disclosed in FIGS. 3f and g in Patent Document 1 requires a step of providing a diffusion source layer to form a low resistance region and a thermal diffusion step for diffusing the diffusion source layer or the like. Thus, the steps are complicated. On the other hand, according to the configuration of the present embodiment, the second trench groove 49 is formed in the same step as that of the first trench groove 19, the dummy trench insulating film 43 is formed in the same step as that of the gate insulating film 41, and the dummy trench 42 is formed in the same step as that of the trench gate 40. Thus, no additional process is particularly required to form the dummy trench 42 or the like and it is thereby possible to simplify the steps.

Although a configuration has been described in the present embodiment where the dummy trenches 42 are formed at two locations at the bottom of the dent 30, the present embodiment is not limited to this. That is, the dent 30 is provided so that the contact layer 18 formed along the dent 30 approximates to the first trench groove 19 and allows holes to efficiently escape to the emitter electrode 52. Therefore, the number of dummy trenches 42 at the bottom of the dent 30 may be determined in relation with the depletion layer that extends to the semiconductor substrate 12 as appropriate. Moreover, the dummy trench 42 need not always be formed at the bottom of the dent 30, but may also be formed in a different region independently of the dent 30.

Likewise, the shape of the dent 30 can also be defined arbitrarily in such a way that the dent 30 approximates to the first trench groove 19 and allows holes to escape to the emitter electrode over a large area.

Embodiment 2

Figure 4:
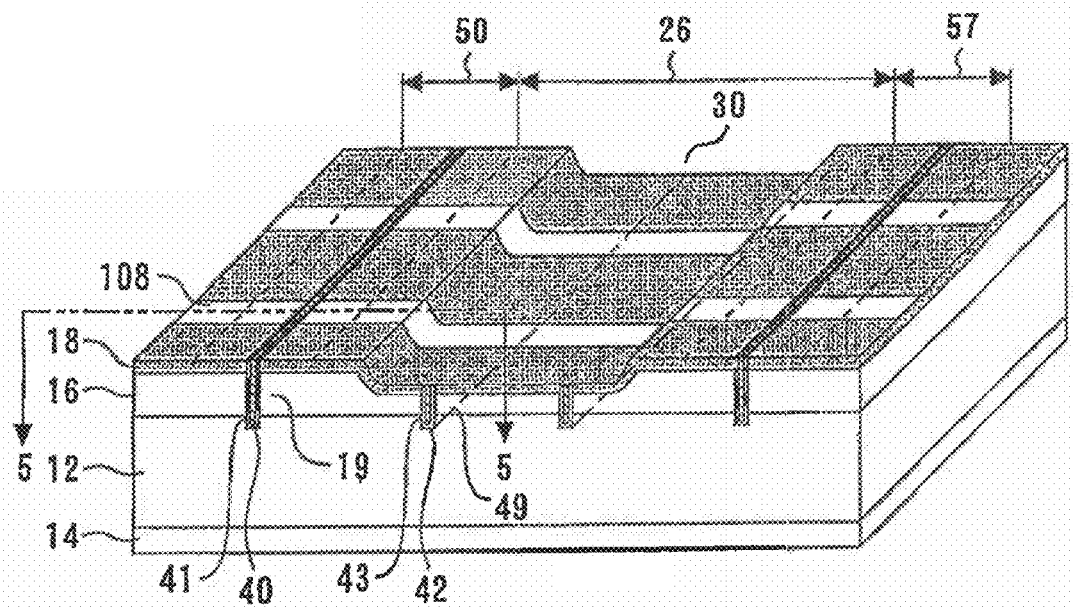
FIG. 4 is a perspective view including a cross section illustrating a power device of the second embodiment of this invention.
Figure 5:
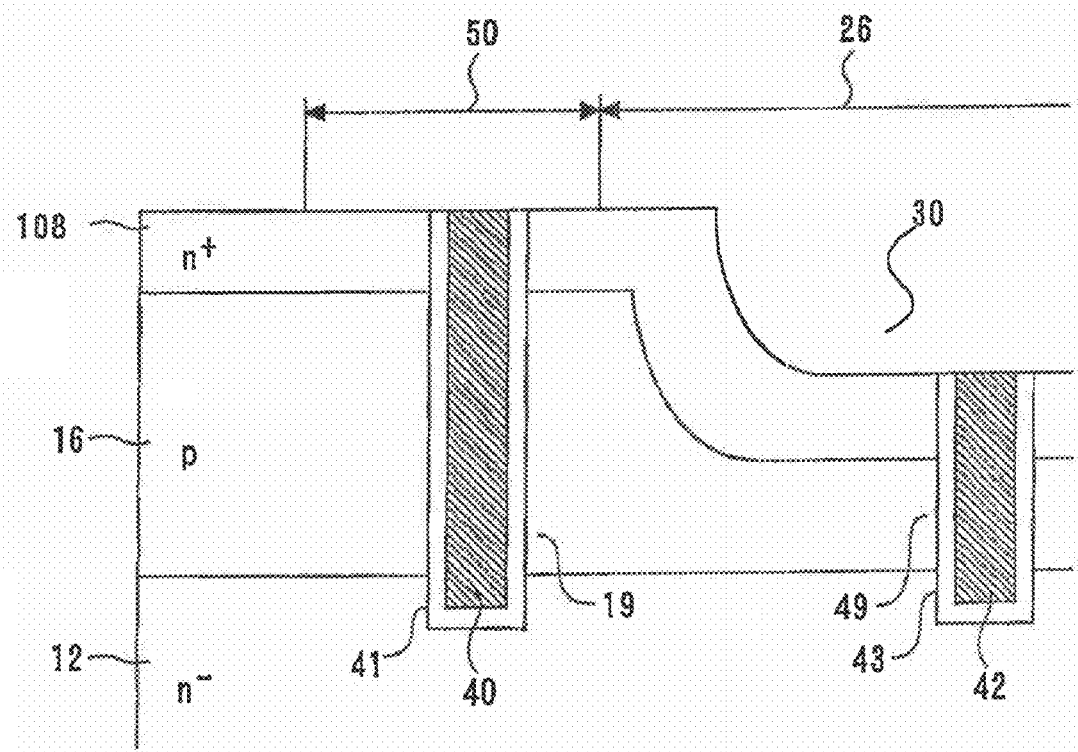
FIG. 5 is a view along a line 5-5 indicated by arrows in FIG. 4.

The present embodiment relates to a power device that can improve characteristics. FIG. 4 is a perspective view including a cross section of the power device of the present embodiment. Furthermore, FIG. 5 is a cross-sectional view along a line 5-5 indicated by arrows. Hereinafter, differences from Embodiment 1 will be described. An emitter region 108 of the present embodiment is formed in a band shape in a direction perpendicular to the trench gate 40. That is, the emitter region 108 is formed over the gate region 50, emitter contact region 26 and neighboring gate region 57.

Thus, the emitter region 108 is also formed in part of the inner wall of the dent 30. There can be a mask mismatch between a masking step for formation of the trench gate 40 and a masking step for formation of the emitter region 108. However, according to the configuration of the present embodiment, it is possible to suppress influences of fluctuations in the contact area between the emitter region and the emitter electrode caused by the mask mismatch on characteristics. Therefore, it is possible to provide such a power device that gm characteristics (saturation current characteristics) of the power device 10 is less likely to be affected by process variations. Furthermore, as for latchup suppression and withstand voltage characteristics, effects equivalent to those of Embodiment 1 can be obtained. Furthermore, it is possible to realize multiple-device production and design changes at low cost as described above.

Embodiment 3

Figure 6:
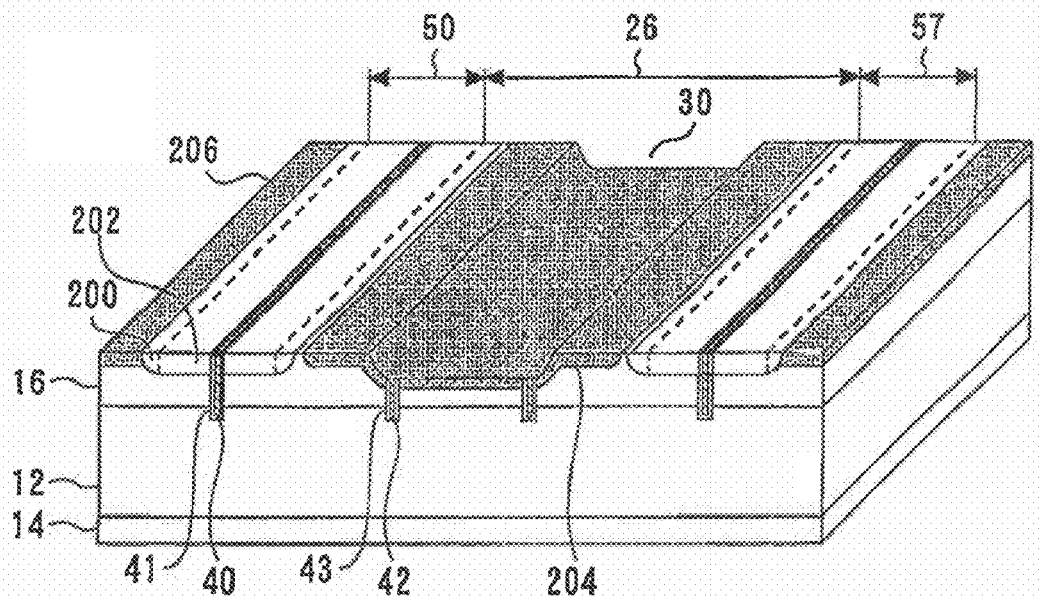
FIG. 6 is a perspective view including a cross section illustrating a power device of the third embodiment of this invention.

The present embodiment relates to a power device having low ON resistance and capable of taking a large saturation current. FIG. 6 is a perspective view including a cross section of the power device of the present embodiment. Hereinafter, differences from Embodiment 1 will be described. An emitter region 202 of the present embodiment is not bridge-shaped as in Embodiment 1 but band-shaped. That is, an emitter extending portion 200 which is a portion of the emitter region 202 that extends to the emitter contact region 26 extends in a band shape parallel to the longitudinal direction of the trench gate 40.

Forming the emitter region 202 in this way causes the emitter region 202 to contact the emitter electrode over a large area, can thereby reduce ON resistance and at the same time take a large saturation current. Moreover, the present embodiment can obtain effects equivalent to those in Embodiment 1 with regard to latchup suppression and withstand voltage characteristics. Furthermore, it is possible to realize multiple-device production and design changes at low cost as described above.

Embodiment 4

Figure 7:
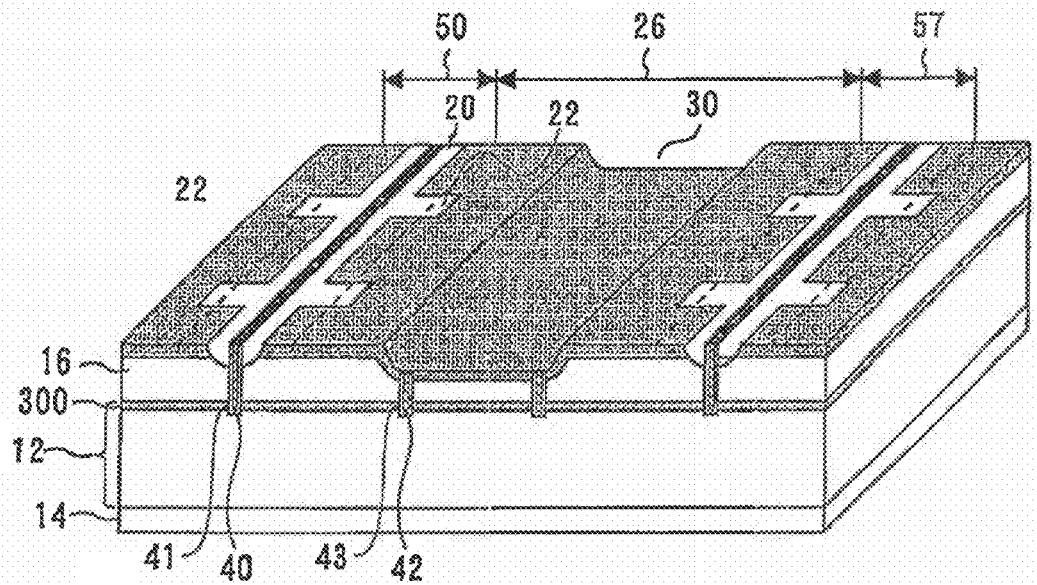
FIG. 7 is a perspective view including a cross section illustrating a power device of the fourth embodiment of this invention.

The present embodiment relates to a power device that suppresses ingression of holes into a base region and effectively suppresses latchup by a parasitic transistor. FIG. 7 is a perspective view including a cross section of the power device of the present embodiment. Hereinafter, differences from Embodiment 1 will be described. A semiconductor substrate 12 of the present embodiment is provided with a carrier storage layer 300 on a surface contacting the base region 16. The carrier storage layer 300 is an n-layer in which n-type dopant is injected. The dopant density of the carrier storage layer 300 is higher than the dopant density of the portion of the semiconductor substrate 12 where the carrier storage layer 300 is not formed.

Forming the carrier storage layer 300 in this way suppresses the injection of holes from the semiconductor substrate 12 into the base region 16. Therefore, in the event of a short circuit or the like, the hole current density in the region of the base region 16 adjoining the first trench groove 19 never increases considerably. Thus, the effect of suppressing latchup of the n-p-n-p structure made up of the emitter region 20 (n-type)-base region 16 (p-type)-semiconductor substrate 12 (n-type)-collector region 14 (p-type) is further enhanced. Furthermore, the presence of the dummy trench 42 allows effects on withstand voltage characteristics equivalent to those of Embodiment 1 to be obtained. Furthermore, it is possible to realize multiple-device production and design changes at low cost as described above.

INDUSTRIAL APPLICABILITY

As described so far, the power device according to the present invention can provide a low-cost power device with a high withstand voltage capable of suppressing latchup.

What is claimed is:

1. A power device comprising:
    a first conductive type semiconductor substrate;
    a second conductive type base region formed on a surface of the semiconductor substrate;
    a second conductive type collector region formed on a rear surface of the semiconductor substrate;
    a first conductive type emitter region formed on a surface of the base region;
    a trench gate formed via a gate insulating film in a first trench groove formed in the base region so as to penetrate the emitter region;
    a dent formed in the base region in proximity to the emitter region;
    a second conductive type contact layer formed on an inner wall of the dent, having a higher dopant density than that of the base region;
    a dummy trench formed via a dummy trench insulating film in a second trench groove formed at a bottom of the dent; and
    an emitter electrode electrically connected to the emitter region, the contact layer and the dummy trench,
    wherein the trench gate and the dummy trench reach the semiconductor substrate.

2. The power device according to claim 1, wherein the emitter region is formed even in part of the inner wall of the dent.

3. The power device according to claim 1, wherein a first conductive type carrier storage layer is formed in a region of the semiconductor substrate contacting the base region, and
    a dopant density of the carrier storage layer is higher than a dopant density of a region of the semiconductor substrate where the carrier storage layer is not formed.

* * * * *